United States Patent
Franceschini et al.

(10) Patent No.: US 8,621,328 B2
(45) Date of Patent: Dec. 31, 2013

(54) WEAR-FOCUSING OF NON-VOLATILE MEMORIES FOR IMPROVED ENDURANCE

(75) Inventors: Michele M. Franceschini, White Plains, NY (US); Ashish Jagmohan, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 346 days.

(21) Appl. No.: 13/040,482

(22) Filed: Mar. 4, 2011

(65) Prior Publication Data

US 2012/0226962 A1 Sep. 6, 2012

(51) Int. Cl.
G11C 29/00 (2006.01)
H03M 13/00 (2006.01)
G06F 13/28 (2006.01)

(52) U.S. Cl.
USPC ............................. 714/773; 714/781; 711/103

(58) Field of Classification Search
None
See application file for complete search history.

(56) References Cited

U.S. PATENT DOCUMENTS

| | | | |
|---|---|---|---|
| 5,341,339 A | 8/1994 | Wells | |
| 5,479,638 A | 12/1995 | Assar et al. | |
| 5,995,418 A | 11/1999 | Chen et al. | |
| 7,080,192 B1 | 7/2006 | Wong | |
| 7,225,291 B2 | 5/2007 | Liang et al. | |
| 7,243,186 B2 | 7/2007 | Liang et al. | |
| 7,340,581 B2 | 3/2008 | Gorobets et al. | |
| 7,353,325 B2 | 4/2008 | Lofgren et al. | |
| 7,409,492 B2 * | 8/2008 | Tanaka et al. | 711/103 |
| 7,450,420 B2 | 11/2008 | Sinclair et al. | |
| 7,478,271 B2 | 1/2009 | Ho | |
| 7,480,760 B2 | 1/2009 | Bernstein et al. | |
| 7,646,636 B2 | 1/2010 | Kim | |
| 7,734,865 B2 * | 6/2010 | Tanaka et al. | 711/103 |
| 2002/0184432 A1 | 12/2002 | Ban | |
| 2006/0095763 A1 * | 5/2006 | Iyengar et al. | 713/167 |
| 2007/0233931 A1 * | 10/2007 | Tanaka et al. | 711/5 |
| 2008/0276038 A1 * | 11/2008 | Tanaka et al. | 711/103 |

(Continued)

FOREIGN PATENT DOCUMENTS

| | | |
|---|---|---|
| JP | 05204561 A2 | 8/1993 |
| JP | 20070156862 A2 | 6/2007 |
| WO | 2005059966 A3 | 7/2006 |

OTHER PUBLICATIONS

Atsuo Kawaguchi et al.; "A Flash Memory Based File System"; In Proceedings of the Winter 1995 USENIX Technical Conference, 1995.

(Continued)

*Primary Examiner* — Daniel McMahon
(74) *Attorney, Agent, or Firm* — Cantor Colburn LLP

(57) ABSTRACT

Storing data in memory using wear-focusing techniques for improved endurance. A method for storing the data includes receiving write data to be written into a memory that is logically divided into a plurality of regions. The plurality of regions includes a first region and a second region that are implemented by the same memory technology. The memory is subject to degradation as a result of write operations. The write data is classified as dynamic data or static data. The write data is encoded using a first type of encoding in response to the write data being classified as dynamic. The write data encoded using the first type of encoding is stored in the first region of the memory. The write data is encoded using a second type of encoding and stored in the second region of the memory in response to classifying the write data as static data.

24 Claims, 6 Drawing Sheets

(56) References Cited

U.S. PATENT DOCUMENTS

| | | | |
|---|---|---|---|
| 2010/0017555 A1* | 1/2010 | Chang et al. | 711/103 |
| 2010/0037001 A1* | 2/2010 | Langlois et al. | 711/103 |
| 2010/0169540 A1* | 7/2010 | Sinclair | 711/103 |
| 2011/0029715 A1* | 2/2011 | Hu et al. | 711/103 |
| 2011/0066788 A1* | 3/2011 | Eleftheriou et al. | 711/103 |
| 2011/0231600 A1* | 9/2011 | Tanaka et al. | 711/103 |
| 2012/0110247 A1* | 5/2012 | Eleftheriou et al. | 711/103 |
| 2012/0303919 A1* | 11/2012 | Hu et al. | 711/165 |

OTHER PUBLICATIONS

David Woodhouse; "JFFS:The Journalling Flash File System"; Ottawa Linux Symposium, 2001 pp. 1-12.

E. Gal et al.; "Algorithms and Data Structures for Flash Memories"; ACM Computing Surveys (CSUR), 2005.

J. Kim et al. A Space-Efficient Flash Translation Layer for Compact Flash Ssytems, IEEE Transactions on Consumer Electronics; vol. 28, No. 2, May 2002 pp. 366-376.

Sungjin Lee et al., "FlexFS: A Flexible Flash File System for MLC NAND Flash Memory," USENIX Annual Technical Conference 2009.

Soojun Im et al.; "Storage Architecture and Software Support for SLC/MLC Combined Flash Memory"; SAC-09, Mar. 8-12, 2009; CM 978-1-60558-166-8/09/03; pp. 1-6.

Xiao-Yu Hu et al.; "Write Amplification Analysis in Flash-Based Solid State Drives"; SYSTOR 2009; pp. 1-9.

Yuan-Hao Chang et al.; "Improving Flash Wear-Leveling by Proactively Moving Static Data"; IEEE, Jan. 2010, pp. 53-65.

Yuan-Hao Chang et al.; Endurance Enhancement of Flash Memory Storage Systems: An Efficient Static Wear Leveling Design; DAC 2007; Jun. 4-8, 2007; San Diego, California; ACM 978-1-59593-627 01/07/0006.

* cited by examiner

WEAR-FOCUSING OF NON-VOLATILE MEMORIES FOR IMPROVED ENDURANCE

BACKGROUND

The present invention relates generally to computer memory, and more specifically to wear-focusing of non-volatile memories.

Phase-change memories (PCMs) and flash memories are examples of non-volatile memories with limited endurance (also referred to as a "limited life"). Such memories have limited endurance in the sense that after undergoing a number of writing cycles (RESET cycles for PCM, program/erase cycles for flash memory), the memory cells wear out and can no longer reliably store information.

Not-and (NAND) flash memories are increasingly being used as non-volatile storage media in both consumer and enterprise applications. A fundamental constraint in these memories is the low endurance of each cell. Specifically, each cell can only be programmed (i.e. written to) and erased a very limited number of times, before it becomes potentially unusable. Further, the endurance of these memories has been decreasing as memory densities increase. For example, the latest multi-level cell (MLC) NAND devices have endurance specifications of only 3,000 to 5,000 program/erase cycles. The relatively low endurance of NAND flash is a major concern, especially in enterprise applications with stringent reliability requirements.

One technique used to prolong the lifetime of a flash device is wear-leveling. As the name suggests, wear-leveling seeks to make the amount of wear uniform across the cells of the memory by spreading writes evenly across the memory. A shortcoming of the wear-leveling approach is that it treats all memory regions and all data identically. Thus, once the entire memory has been cycled to the specified endurance limit, it is treated as potentially unusable. In reality, the endurance limit of flash is not a hard limit; instead as a cell is cycled more, its retention decreases and the probability of a bit error increases smoothly. Thus, there is a trade-off between data retention/cell-error and endurance.

SUMMARY

An embodiment is a computer implemented method for storing data in memory. The method includes receiving write data to be written into a memory that is logically divided into a plurality of regions. The plurality of regions includes a first region and a second region that are implemented by the same memory technology. The memory is subject to degradation as a result of write operations. The write data is classified as dynamic data or static data. The write data is encoded using a first type of encoding in response to the write data being classified as dynamic. The write data encoded using the first type of encoding is stored in the first region of the memory. The write data is encoded using a second type of encoding and stored in the second region of the memory in response to classifying the write data as static data.

Another embodiment is a system that includes a memory and a memory controller. The memory is logically divided into a plurality of regions including a first region and a second region. The first region and the second region are implemented by the same memory technology, and the memory is subject to degradation as a result of write operations. The memory controller is in communication with the memory and is configured to perform a method. The method includes receiving write data, and classifying the write data as dynamic data or static data. The write data is encoded using a first type of encoding and stored in the first region of memory in response to classifying the write data as dynamic data. The write data is encoded using a second type of encoding and stored in the second region of the memory in response to classifying the write data as static data.

A further embodiment is a computer program product for storing data in memory. The computer program product includes a tangible storage medium readable by a processing circuit and storing instructions for execution by the processing circuit for performing a method. The method includes receiving write data to be written into a memory that is logically divided into a plurality of regions. The plurality of regions includes a first region and a second region that are implemented by the same memory technology. The memory is subject to degradation as a result of write operations. The write data is classified as dynamic data or static data. The write data is encoded using a first type of encoding in response to the write data being classified as dynamic. The write data encoded using the first type of encoding is stored in the first region of the memory. The write data is encoded using a second type of encoding and stored in the second region of the memory in response to classifying the write data as static data.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
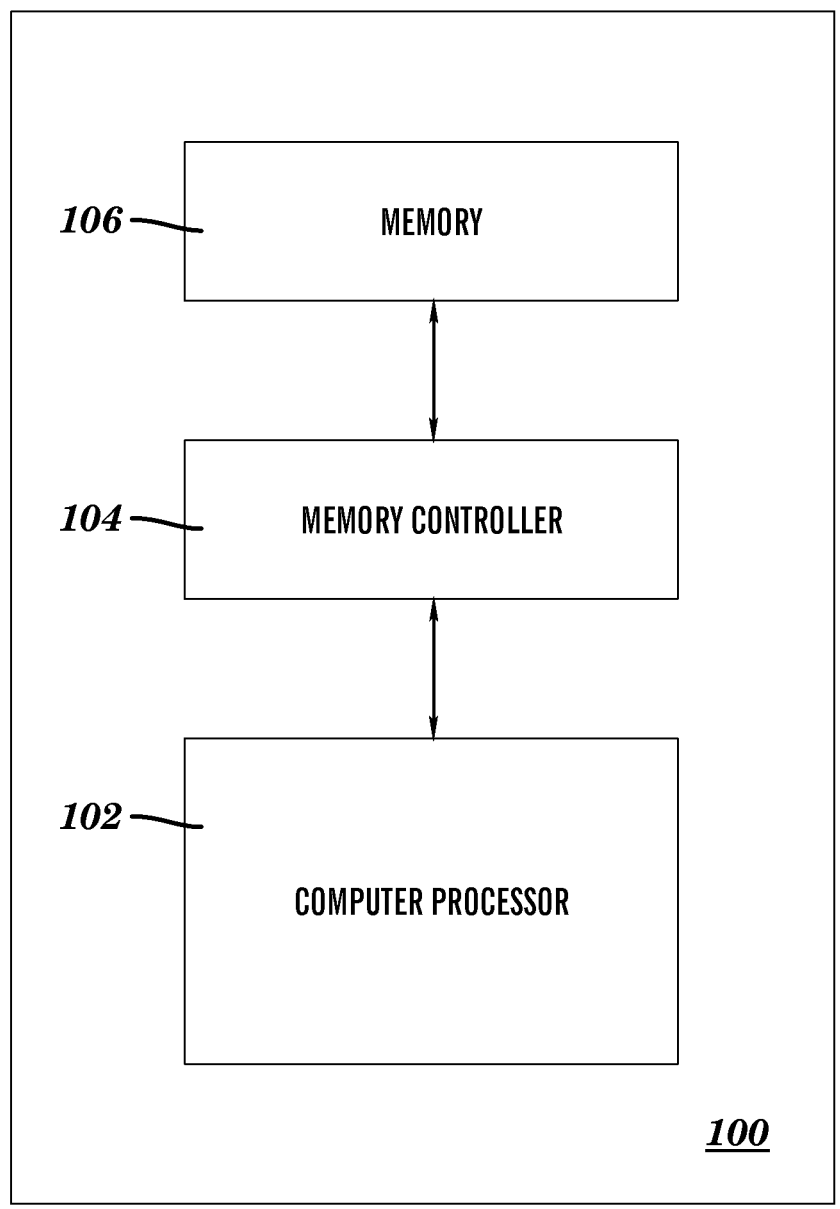
FIG. 1 illustrates a block diagram of a system for storing and retrieving data in a memory in accordance with an embodiment.

An embodiment of the present invention improves the lifetime of a storage device based on flash memory by leveraging the soft endurance limit behavior of not-and (NAND) flash memory for enterprise workloads that are characterized by non-uniform data access frequency (e.g. part of the data is frequently updated, while the rest of the data is less frequently updated). As used herein, the term "dynamic data" refers to the data that is frequently updated and the term "static data" refers to the data that is less frequently or rarely updated.

In an embodiment, a memory such as a flash memory (made up of one or more NAND flash memory devices) is virtually partitioned into two regions, a "wear-focused region" or "dynamic data region" for storing dynamic data, and a "static data region" for storing static data. Frequently updated data is stored in the wear-focused data region (typically a smaller region of memory compared to the static data region) and thus the wear-focused data region wears out much faster than the static data region. In general, the wear-focused region is expected to have a higher bit-error rate (BER) and lower retention because of the higher level of writes to memory that occur in that region of memory. The lower retention is not a problem because the dynamic data is frequently updated and thus requires only low retention guarantees. In an embodiment, adaptive endurance coding and stronger error correction codes (ECCs) are used to mitigate the higher BER. The increased redundancy is not problematic because the wear-focused region is only a small part of the memory. An advantage to this process is that the static data region is written very rarely since the wear-focused region filters out most of the writes. Thus, the rate of wear of the static data region is considerably reduced. The lifetime of the entire device, which is governed by the retention guarantees required by the static data, is thus significantly increased. Embodiments, as described herein, are applicable to other non-volatile memory technologies where retention is a function of memory cycling.

An embodiment includes a memory controller that controls how data is written to a physical memory. In one embodiment, the physical memory is made up of one or more NAND flash memory devices, each memory device including a plurality of blocks of memory cells for storing data. The controller virtually partitions the NAND Flash memory into two regions: a wear-focused region and a static data region, with each region including a set of memory blocks for storing data. In an embodiment, each block also contains time-stamp information including one or more time-stamp records detailing when the data was previously updated. The wear-focused region is meant to store dynamic data (e.g., data that is frequently updated), while the static data region is for storing static data (e.g., data that is rarely updated).

The time stamp information helps to identify whether a particular quantum of stored data is static or dynamic. In one embodiment, the time stamp information is stored on a per-block or per-page basis. Upon receiving data to be written, the memory controller first classifies the data as static or dynamic. In one embodiment, the classifying is performed using the time-stamp information associated with the write address. In another embodiment, the classifying is performed using other metadata stored in the controller in conjunction with or instead of the time-stamp information. In an embodiment, the metadata includes cached time-stamp information to allow for fast classification without requiring a read from a memory device. In another embodiment, the metadata also includes information about spatially and temporally adjacent write addresses, which allow the classification to exploit spatial and temporal correlations in the data characteristics.

If the data is classified as dynamic, it is optionally coded using an adaptive endurance code (AEC) and a first ECC (ECC-1). In one embodiment the adaptive endurance coding process includes performing lossless compression followed by the application of a constrained AEC code that generates a bit-pattern which reduces wear and/or the probability of bit-level errors being written into memory. Examples of AEC codes that may be implemented include, but are not limited to: constant weight codes or bounded weight codes. The adaptive endurance coding and error correction coding may be done jointly. The coded data is then written to the wear-focused data region of the memory. In one embodiment, the data address is mapped from a logical to physical write address for the purpose of wear-leveling and/or write-amplification reduction.

If the data is classified as static, it is encoded using a second ECC (ECC-2) and is then written to the static data region after a logical to physical write address mapping done for the purpose of wear-leveling and/or write-amplification reduction. In one embodiment, the associated time-stamp is also stored. In an embodiment, ECC-1 is a stronger code (i.e., it is designed to detect and correct more errors) than ECC-2 because the wear-focused region is expected to undergo greater wear and have a correspondingly higher bit error rate. As used herein, the term "stronger ECC code" refers to an error correcting code that is capable of correcting a larger number of errors per stored byte. In this sense a BCH code with a codeword length 511 and capable of correcting 10 errors, and storing 421 information bits is stronger than a BCH code with a codeword length 511 and capable of correcting 5 errors, and storing 466 information bits. Possible options for ECC-1 and ECC-2 include but are not limited to BCH codes, Reed-Solomon codes, Turbo Codes, and LDPC codes. In exemplary embodiments ECC-1 and ECC-2 are the same code (i.e., they coincide). In additional exemplary embodiments ECC-2 is a stronger code than ECC-1.

In accordance with an embodiment, data is shifted (i.e., moved) from the wear-focused region to the static data region of the memory and vice-versa on an intermittent basis. This is done if the update frequency characteristics of a given write-address changes over time, and thus if data that was formerly static has become dynamic and vice-versa. In one embodiment, the static to dynamic transfer is performed when write data corresponding to the write-address is received at the controller, and the classification algorithm determines that the data is being updated frequently enough to qualify as dynamic data. In one embodiment, the dynamic to static data transfer is performed periodically (e.g., every x amount of time, every y number of accesses to the memory, etc.). In a further embodiment, the dynamic to static data transfer is performed periodically when the wear-focused region has less than a certain threshold of available free-space, or at the time of classification. The decision to transfer data may be made in a manner identical to the write classification or, in the case of the wear-focused region running out of space, may be made on the basis of a least-recently used (LRU) policy based, for example, on the last time-stamp. In one embodiment, a dynamic to static re-classification module initiates AEC decoding and ECC-1 decoding, followed by ECC-2 encoding.

FIG. 1 illustrates a block diagram of a system for storing and retrieving data in a memory in accordance with an embodiment. The system 100 depicted in FIG. 1 includes a computer processor 102, a memory 106 having memory cells, and a memory controller 104 for receiving data from the computer processor 102 to be stored in the memory 106. In an embodiment, the memory cells are arranged into pages, and pages are arranged into blocks. Thus, a block may contain a plurality of pages, each page containing a plurality of memory cells.

In one embodiment the memory controller 104 is in communication with, or communicatively coupled to, the computer processor 102 and receives write requests from the computer processor 102. The write requests contain data to be written to the memory 106 and a logical address for identifying the location in the memory 106 to which the data will be written. The memory controller 104 stores data at a physical address within the memory 106. In an embodiment, the memory controller 104 maps the logic address to a physical address in the memory 106 when storing or retrieving data. The physical address for a given logical address can change each time data in the memory 106 is modified.

The system 100 is one example of a configuration that may be utilized to perform the processing described herein. Although the system 100 has been depicted with only a single memory 106, memory controller 104, and computer processor 102, it will be understood that other embodiments would also operate in other systems with two or more of the memory 106, memory controller 104, or computer processor. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

Figure 2:
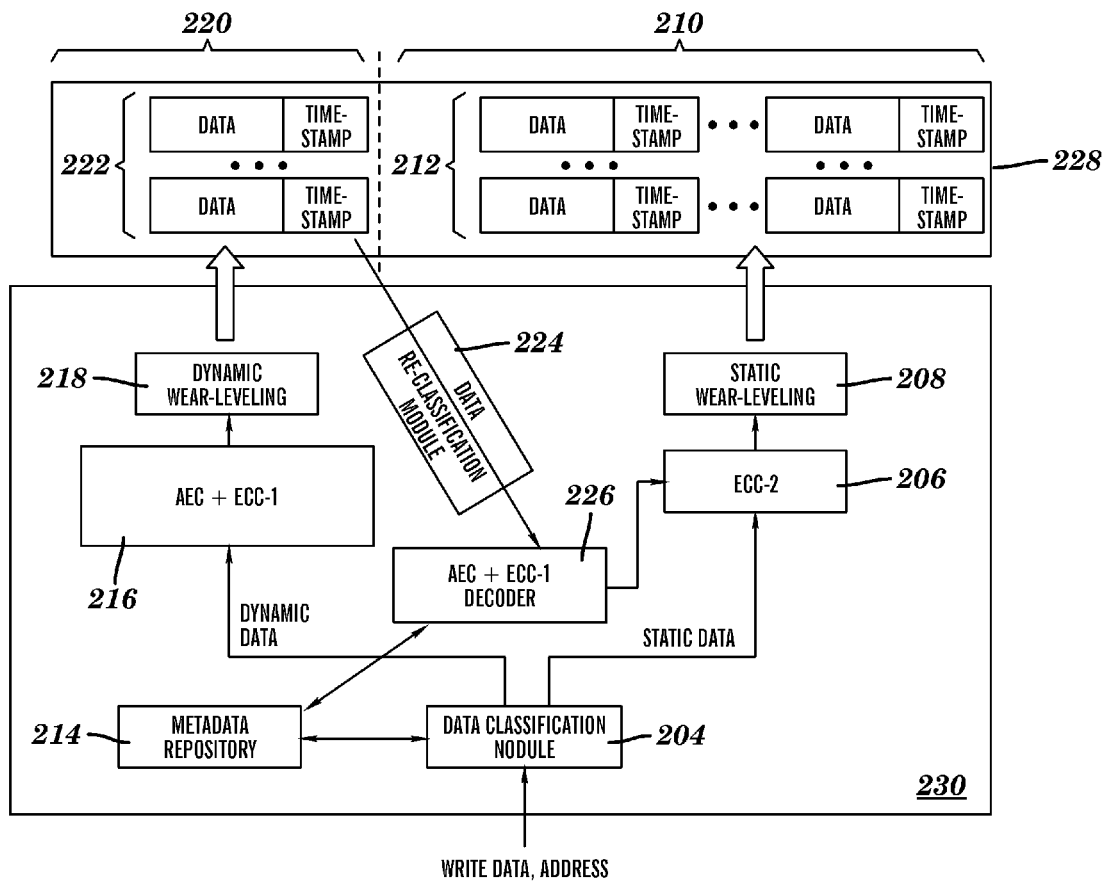
FIG. 2 illustrates a more detailed view of a memory and a memory controller in accordance with an embodiment.

FIG. 2 illustrates a detailed view of a memory and memory controller, in accordance with an embodiment. As shown in FIG. 2, write data and an address (e.g., a logical address corresponding to the write data and specifying where the write data should be written) are received at a memory controller 230. In an embodiment, a data classification module 204 classifies the write data as static or dynamic. In one embodiment, the write data is classified based on a timestamp associated with the received address. The timestamp indicates when the data in that memory address was last modified. In one embodiment, the write data contains metadata that indicates if the write data is static or dynamic, and the metadata is input to the data classification module 204. The data classification module 204 interprets metadata values that are stored and retrieved from a metadata repository 214. The metadata stored in the metadata repository 214 may include cached time-stamp information to allow for fast classification without requiring a read from a memory 228. The metadata may also include information about spatially and temporally adjacent write addresses, which allow the data classification module 204 to exploit spatial and temporal correlations in the data characteristics. In additional embodiments, other metadata, including dynamic and static data aware tags transmitted along with the write data, may be stored and read from the metadata repository 214.

If the write data has been classified as dynamic, it is sent to a dynamic encoder module 216. In one embodiment, the dynamic encoder module 216 first encodes the data using an AEC encoder. In one embodiment, the dynamic encoder module 216 encodes the write data using a first ECC (ECC-1). In one embodiment, once the write data is encoded, it is processed by a dynamic wear-leveling module 218, which writes the write data to the memory 228. Any wear-leveling process known in the art may be implemented by the dynamic wear-leveling module 218, including but not limited to the wear leveling that comes from the use of a log-based structure, from techniques which remap the logical to physical address mappings and/or from specific wear leveling algorithms using, for example, write counters to enable efficient selection of the blocks to be erased during garbage collection.

In one embodiment the memory 228 is logically divided into two regions, a dynamic data region 220 and a static data region 210. The size of each region may be determined based on the workload requirements of the system. In one embodiment, the size of the dynamic data region 220 is determined based on a plotted frequency of writes such that a predetermined fraction of the writes are fulfilled by the dynamic data region 220. This subdivision allows to reparation in the average the total write load to the two regions. One embodiment selects the write load partitioning in such way that, after a given number of years of operation, the retention time of the wear-focused region is greater than a first given retention time r1, and the retention time of the other region, i.e., the static data region is a given retention time r2 (generally, r2 will be much larger than r1, for example r1 can be one day and r2 can be 1 year). To this end, either measurements or a model for the projected error rate and projection retention of the memory 228 as a function of the number of program/erase cycles is needed.

In another embodiment, the size of the dynamic data region 220 is initially configured to be a percentage of the memory 228 (e.g. 20%). As data is stored in the memory 228 the dynamic data region 220 is adjusted to suit the specific needs of the system. For example, if the amount of data that is classified as dynamic exceeds the amount of available space in the dynamic data region 220, the dynamic data region 220 will expand and the static data region 210 will be reduced.

Although the embodiments described herein refer to a single dynamic data region 220 in the memory 228, it will be understood that in alternate embodiments, a plurality of dynamic data regions may be created. Each of the plurality of dynamic data regions may be configured with an update frequency threshold such that one dynamic data region will accommodate the most frequently updated data and each of the other dynamic data regions will accommodate data that is progressively less frequently updated.

In one embodiment, the dynamic wear-leveling module 218 writes the dynamically classified data in the dynamic data region 220 of the memory 228. The write data 202 is written as a dynamic data record 222 to the dynamic data region 220 in combination with a timestamp corresponding to the time when the data was written to the memory 228. In alternate embodiments, the dynamic data record 222 may be written to the dynamic data region 220 without a timestamp. Although the data and timestamp are illustrated in FIG. 2 as a single dynamic record layout, it will be understood that in alternate embodiments the timestamp may be located elsewhere in the memory 228, or in a separate memory location or cache module.

If the write data has been classified as static, it is sent to a static encoder module 206. In one embodiment, the static encoder module 206 encodes the write data using a second ECC (ECC-2). As described previously, ECC-1, which is used for the dynamic data, is typically a stronger ECC (e.g., detects/corrects more errors) than ECC-1, which is used for static data. In additional embodiments, the static encoder module 206 encoder may encode the write data using any other error correction and detection algorithm as is known in the art. Once the write data has been encoded, it is processed by a static wear-leveling module 208, which writes the write data to a static data region 210 of the memory 228. In one embodiment, the static wear-leveling module 208 and the dynamic wear-leveling module 218 are a single module, performing the same process. In another embodiment, the static wear-leveling module 208 and the dynamic wear-leveling module 218 are performed independently using different processes.

The data is written as a static data record 212 to the static data region 210 in combination with a timestamp corresponding to the time when the data was written to the memory 228. In alternate embodiments, the static data record 212 is written to the static data region 210 without a timestamp. Although the data and timestamp are illustrated in FIG. 2 as a single static record layout, it will be understood that in alternate embodiments the timestamp may be located elsewhere in the memory 228, or in a separate memory location.

In one embodiment, the write data that was written to the dynamic data region 220 may be re-classified as static data based on a number of factors as described herein. A data re-classification module 224 may then initiate the re-classification of the dynamic data as static data. In an embodiment, a dynamic decoder 226 decodes the dynamic data, reversing the encoding performed by the dynamic encoder module 216. The decoded data is then re-encoded by the static encoder module 206 and stored in the static data region 210 as described above.

Figure 3:
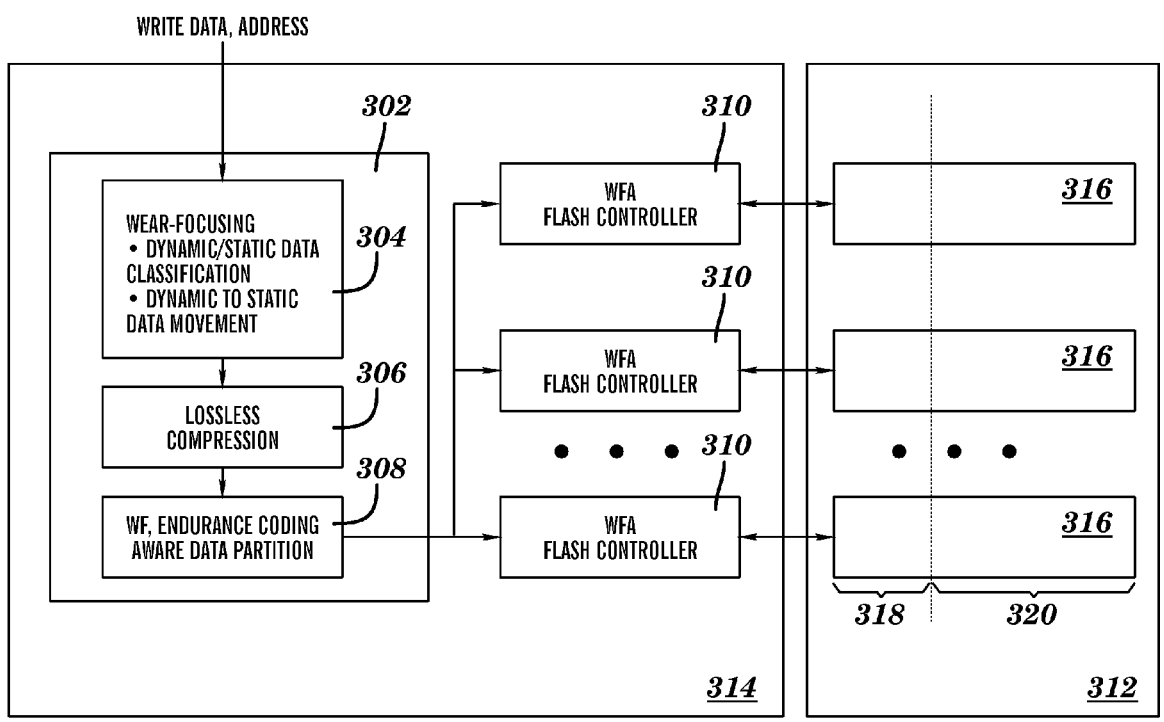
FIG. 3 illustrates a block diagram of a system for wear-focusing of data on non-volatile memory in accordance with an embodiment where a memory includes both dynamic and static data.

FIG. 3 illustrates a block diagram of a detailed embodiment of a memory and a memory controller in accordance with an embodiment. As shown in FIG. 3, write data and an address are received at a memory controller 314. In one embodiment, the memory controller 314 includes a high-level memory controller 302 and one or more wear-focus aware flash controllers (WFA flash controllers) 310. In one embodiment, the high-level memory controller 302 includes a wear-focusing module 304 to perform the dynamic/static data classification and the dynamic to static data movement described above. In an embodiment, the high-level memory controller 302 includes a compression module 306 to perform lossless compression on the write data. In an alternate embodiment, the high-level memory controller 302 does not include the compression module 306 and the write data is processed without compression.

The high-level memory controller 302, depicted in FIG. 3 includes a partition module 308. The partition module 308 passes the write data, data classification information, and optionally the encoding requirements (ECC and AEC if the data is classified as dynamic) to the one or more WFA flash controllers 310. One of the one or more WFA flash controllers 310 receives the write data, data classification information, and the encoding requirements from the partition module 308 and encodes the write data according to the encoding requirements. As depicted in FIG. 3, each WFA flash controller 310 is communicatively coupled to a flash memory array 312 that includes one or more memories 316 (e.g. each memory made up of one or more memory devices). In one embodiment, each of the WFA flash controllers 310 is associated to one memory 316. In an alternate embodiment, one of the WFA flash controllers 310 is associated to more than one memory 316. In an embodiment, each memory 316 in the flash memory array 312 is divided into two physical areas, a dynamic data region 318, and a static data region 320. Once one of the WFA flash controllers 310 has encoded the write data, the WFA flash controller 310 stores the data that is classified as dynamic in the dynamic data region 318 and the data that is classified as static in the static data region 320.

Although the memory controller 314 is depicted in FIG. 3 as containing the high-level memory controller 302 and the WFA flash controllers 310, it will be understood that the various modules can be implemented in various configurations, for example the WFA flash controllers 310 may be physically located in the flash memory array 312.

Figure 4:
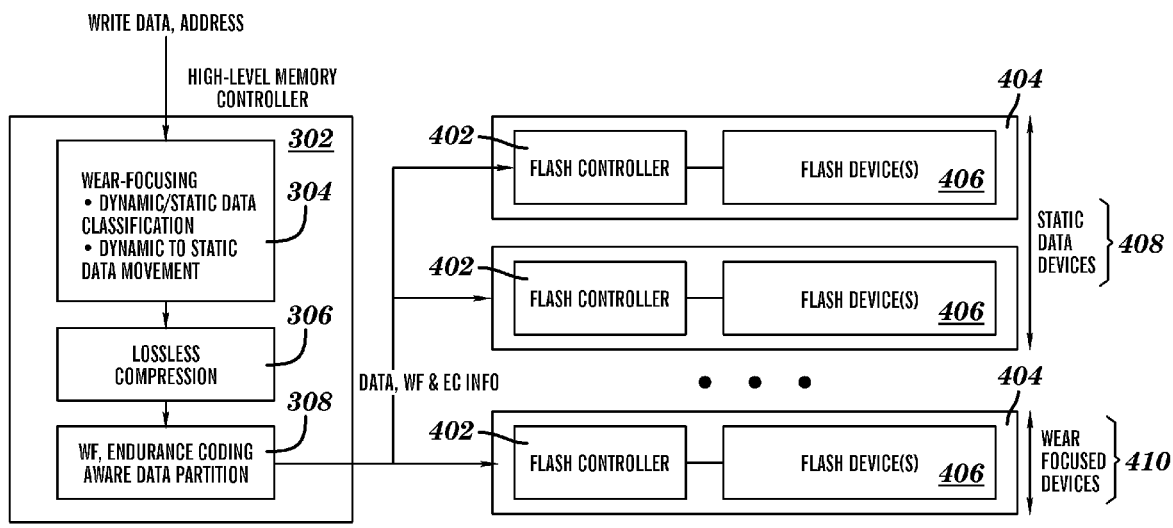
FIG. 4 illustrates a process flow for wear-focusing of data in accordance with an embodiment where a memory includes either dynamic or static data.

FIG. 4 illustrates a block diagram of a detailed embodiment of a memory and a memory controller in accordance with an embodiment where portions of the memory controller functions are located in the memory. As shown in FIG. 4, the high-level memory controller 302 communicates with memories 404 that include both a flash controller 402 and one or more flash memory devices 406. As shown in FIG. 4, each memory 404 is classified as having either all static memory devices 408 or all wear-focused memory devices 410. An advantage to this configuration, where the static and dynamic data are stored on different memory devices (i.e., each memory device is occupied by at most one region), is that entire memory devices or memories may be replaced in a non-disruptive manner. A possible disadvantage is that the write bandwidth on the wear focused region is limited to the write bandwidth of the flash chips and flash controllers devoted to the wear-focused region.

Figure 5:
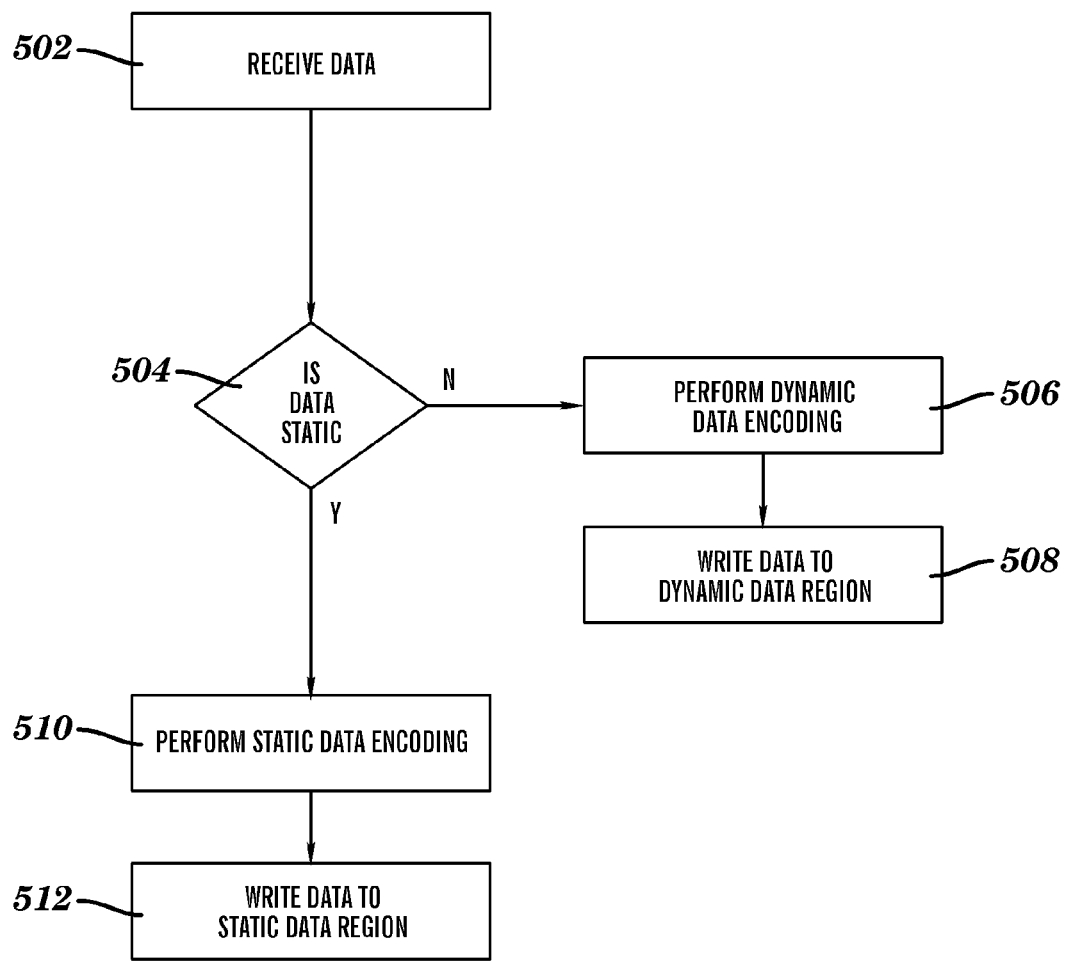
FIG. 5 illustrates a process flow for classifying data in accordance with an embodiment.

FIG. 5 illustrates a process flow for processing write data that may be executed by a memory controller, such as memory controller 230 of FIG. 2 or memory controller 314 of FIG. 3, or a combination of the flash controller 402 and high-level memory controller 302 of FIG. 4. At block 502, write data is received. At block 504, the received data is classified as dynamic or static using one or more of the methods described herein. If the data is dynamic, block 506 is performed to encode the write data as dynamic data, and at block 508, the encoded data is written to the dynamic data region of the memory. If the data is static, as determined at block 504, block 510 is performed to encode the write data as static data. At block 512, the encoded data is written to the static data region of the memory.

In an embodiment, it is determined (e.g., by wear-focusing module 304) if the write data is static based on a last modified timestamp associated with the logic address to which the write data is being written. In an embodiment, the wear-focusing module 304 is configured with a programmable threshold value that is compared to the timestamp. If the logical address has been written to sooner than the threshold value the data is classified as dynamic. Otherwise the data is classified as static.

In another embodiment, metadata is received to indicate if the write data is static or dynamic. In one embodiment, the metadata is provided through an application programming interface (API) by an application that is storing the write data in the memory. In another embodiment, the metadata is provided by an operating system and/or a classification module outside of the memory controller and passed in with the write data. In yet another embodiment, the classification of the data is cached in a metadata repository when the write data is originally written to the memory, and the wear-focusing module 304 retrieves the classification from the metadata repository upon receipt of the write data. Using the metadata repository allows for efficient classification of the write data without requiring a memory read to retrieve the timestamp from the memory.

Figure 6:
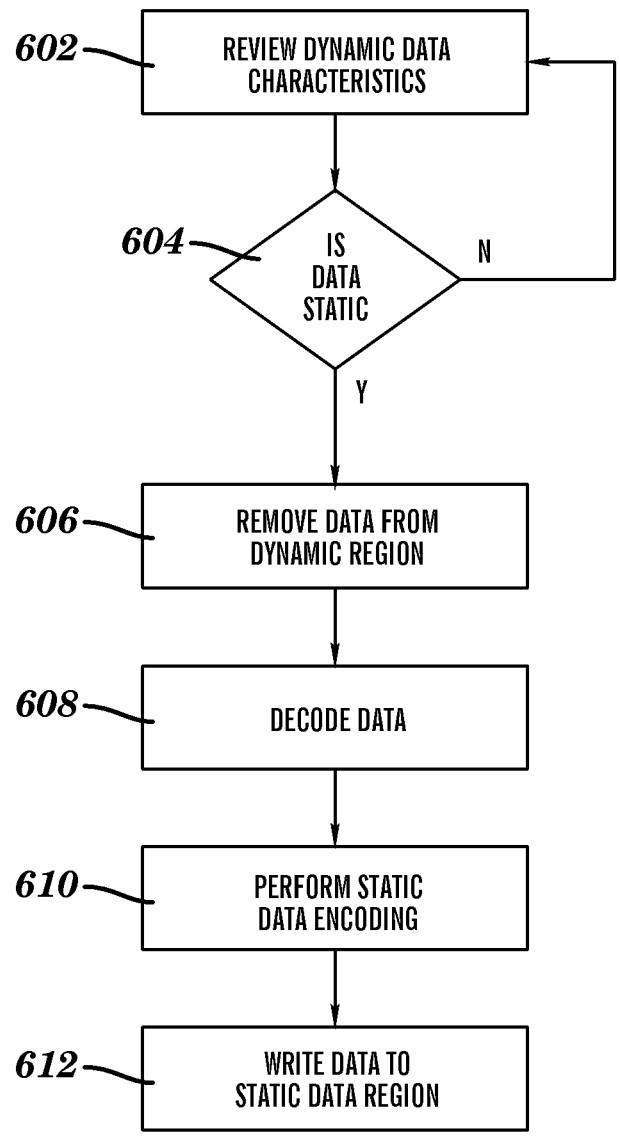
FIG. 6 illustrates a process flow for re-classifying dynamic data as static data in accordance with an embodiment.

FIG. 6 illustrates a process flow for reclassifying dynamic data as static data. In an embodiment, the process depicted in FIG. 6 is executed by the memory controller 230 depicted in FIG. 2. The processing depicted in FIG. 6 may also be performed by a memory controller implemented by memory controller 314 of FIG. 3, or by a combination of the flash controller 402 and high-level memory controller 302 of FIG. 4. At block 602, the data re-classification module 224 of FIG. 2 scans the contents of the dynamic data region 220. In an embodiment, a timestamp associated with the dynamic data is read to determine if the data is now static. In one embodiment, the data re-classification module 224 is configured with a threshold value to indicate the maximum time that the data can remain unchanged before being considered static. If the timestamp is larger than the threshold, (i.e. the dynamic data has been unmodified for longer than the threshold value) the data is reclassified as static data. If it has been determined, at block 604, that the data is now static, block 606 is performed to remove the data from the dynamic data region 220. At block 608, the data is decoded by the dynamic decoder 226 of FIG. 2 to remove the encoding applied to the data before it was stored in the dynamic data region 220. At block 610, the static encoder module 206 encodes the data for storage in the static data partition. In addition, static wear-leveling may be performed on the encoded data by the static wear-leveling module 208. At block 612, the data is stored in the static data region 210 of the memory.

In an additional embodiment, dynamic data is moved to the static region based on the estimated durability of the data. As stated above, non-volatile memory degrades as data is written to it. Because the dynamic data is written to the dynamic data region 220 of FIG. 2 more frequently than static data is written to the static data region 210, the dynamic data region 220 will be subject to degradation more quickly than the static data region 210. As the dynamic data region 220 degrades the length of time that data can be safely stored in that region decreases.

Technical effects and benefits include prolonging the useful life of non-volatile memory by dividing the non-volatile memory into two or more data regions. In addition, the dynamic data and static data can be moved from one memory region to another as the data is updated over time based on a configurable threshold value further increasing the useable life of the non-volatile memory. Embodiments described herein are flexible in that the dynamic and static regions may be configured, and their size adjusted dynamically.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A computer implemented method for storing data in memory, the method comprising:
    receiving write data to be written into a memory that is logically divided into a plurality of regions, the plurality of regions including a first region and a second region, the first region and the second region implemented by the same memory technology, and the memory subject to degradation as a result of write operations;
    classifying the write data as dynamic data or static data, the classifying including comparing a timestamp associated with a write address for the write data with a programmable threshold value;
    in response to classifying the write data as dynamic data performing:
        encoding the write data using a first type of encoding; and
        storing the write data encoded using the first type of encoding in the first region of the memory; and
    in response to classifying the write data as static data performing:
        encoding the write data using a second type of encoding; and
        storing the write data encoded using the second type of encoding in the second region of the memory.

2. The method of claim 1, wherein the memory technology is flash memory.

3. The method of claim 1, wherein the first type of encoding detects and corrects more errors than the second type of encoding.

4. The method of claim 1, wherein the first region is smaller than the second region.

5. The method of claim 1, further comprising receiving metadata for the write data, wherein the metadata is an input to the classifying.

6. The method of claim 1, wherein stored data is moved from the first region to the second region based on a re-classification of the stored data from dynamic data to static data.

7. The method of claim 1, wherein stored data is moved from the second region to the first region based on a re-classification of the stored data from static data to dynamic data.

8. The method of claim 1, wherein the memory comprises a plurality of memory devices and each memory device contains portions of more than one of the plurality of regions.

9. The method of claim 1, wherein the memory comprises a plurality of memory devices and each memory device is occupied by at most one of the plurality of regions.

10. The method of claim 1, further comprising performing wear-leveling of the data for each of the plurality of regions.

11. The method of claim 1, wherein a size of each of the plurality of regions is determined by a plotted frequency of writes, wherein a percentage of writes are stored in the first region based on a projected retention of the second region.

12. A system comprising:
    a memory logically divided into a plurality of regions, the plurality of regions including a first region and a second region, the first region and the second region implemented by the same memory technology, and the memory subject to degradation as a result of write operations; and
    a memory controller in communication with the memory, the memory controller configured to perform a method, the method comprising:
    receiving write data;
    classifying the write data as dynamic data or static data, the classifying including comparing a timestamp associated with a write address for the write data with a programmable threshold value;
    in response to classifying the write data as dynamic data performing:
        encoding the write data using a first type of encoding; and
        storing the write data encoded using the first type of encoding in the first region of the memory; and
    in response to classifying the write data as static data performing:
        encoding the write data using a second type of encoding; and
        storing the write data encoded using the second type of encoding in the second region of the memory.

13. The system of claim 12, wherein the first type of encoding detects and corrects more errors than the second type of encoding.

14. The system of claim 12, wherein the first region is smaller than the second region.

15. The system of claim 12, wherein the method further comprises receiving metadata for the write data, and the metadata is an input to the classifying.

16. The system of claim 12, wherein stored data is moved from the first region to the second region based on a re-classification of the stored data from dynamic data to static data, and moved from the second region to the first region based on a re-classification of the stored data from static data to dynamic data.

17. The system of claim 12, wherein the memory is a flash memory device.

18. A computer program product for storing data in memory, the computer program product comprising:
    a non-transitory tangible storage medium readable by a processing circuit and storing instructions for execution by the processing circuit for performing a method comprising:
    receiving write data to be written into a memory that is logically divided into a plurality of regions, the plurality of regions including a first region and a second region, the first region and the second region implemented by the same memory technology, and the memory subject to degradation as a result of write operations;

classifying the write data as dynamic data or static data, the classifying including comparing a timestamp associated with a write address for the write data with a programmable threshold value;

in response to classifying the write data as dynamic data performing:
   encoding the write data using a first type of encoding; and
   storing the write data encoded using the first type of encoding in the first region of the memory; and in response to classifying the write data as static data performing:
   encoding the write data using a second type of encoding; and
   storing the write data encoded using the second type of encoding in the second region of the memory.

19. The computer program product of claim 18, wherein the memory technology is flash memory.

20. The computer program product of claim 18, wherein the first type of encoding detects and corrects more errors than the second type of encoding.

21. The computer program product of claim 18, wherein stored data is moved from the first region to the second region based on a re-classification of the stored data from dynamic data to static data, and moved from the second region to the first region based on a re-classification of the stored data from static data to dynamic data.

22. The computer program product of claim 18, wherein the write address is a logical address.

23. The method of claim 1, wherein the write address is a logical address.

24. The system of claim 12, wherein the write address is a logical address.

* * * * *